US006005409A

United States Patent [19]

Bui et al.

[11] Patent Number: 6,005,409

[45] **Date of Patent: *Dec. 21, 1999**

[54] DETECTION OF PROCESS-INDUCED DAMAGE ON TRANSISTORS IN REAL TIME

[75] Inventors: Nguyen D. Bui, San Jose; Chenming Hu, Alamo; Donggun Park, Albany; Scott Zheng, Sonoma, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/657,485

[22] Filed: Jun. 4, 1996

[51] Int. Cl.[6] .................................................. G01R 31/26

[52] U.S. Cl. ........................................ 324/769; 324/765

[58] Field of Search ................................ 324/768, 769, 324/765

[56] References Cited

U.S. PATENT DOCUMENTS

| | | | |
|---|---|---|---|
| 3,796,955 | 3/1974 | Bhattacharyya et al. | 324/769 |
| 3,978,405 | 8/1976 | Petree | 324/765 |
| 5,654,925 | 8/1997 | Koh et al. | 365/201 |

*Primary Examiner*—Josie Ballato
*Assistant Examiner*—Russell M. Kobert
*Attorney, Agent, or Firm*—Sawyer & Associates

[57] ABSTRACT

A method for detecting damage in a plurality of transistors includes measuring at least one characteristic of the plurality of transistors, applying a constant voltage of a predetermined voltage level for a predetermined period of time, and re-measuring the at least one characteristic of the plurality of transistors, wherein a change in the at least one characteristic indicates damage to the plurality of transistors. In one aspect, the predetermined voltage level is about 9 MV/cm, and the predetermined period of time is about 1 second. In a further aspect, measuring at least one characteristic includes measuring threshold voltage, and the change in the at least one characteristic includes a shift in the threshold voltage. In another embodiment, a method for monitoring damage in unprotected plurality of transistors during wafer fabrication includes performing a test sequence including applying a constant voltage of a predetermined voltage level for a predetermined period of time, and utilizing the test sequence in-line with the wafer fabrication. In addition, detecting damage further includes programmably controlling the steps of performing and utilizing during wafer fabrication, wherein programmably controlling is performed with a computer system.

10 Claims, 7 Drawing Sheets

DETECTION OF PROCESS-INDUCED DAMAGE ON TRANSISTORS IN REAL TIME

FIELD OF THE INVENTION

The present invention relates to damage detection in transistors, and more particularly to damage detection in transistors in-line with wafer fabrication.

BACKGROUND OF THE INVENTION

During the process of production of field effect transistors, e.g., MOSFETs, plasma etching is commonly used. Low temperature gas annealing following etching often hides damage and passivates traps in the transistors without restoring long-term reliability. The effects of plasma etching or ion bombardment techniques are often monitored to determine the amount of charging damage being done to the transistors.

In a conventional method for detecting damage due to plasma etching, characteristics of the transistor(s) under test are measured. These characteristics include the threshold voltage, $V_t$. Typically, a current of about 1 nA (nanoampere) per transistor gate or approximately 0.1 nA/square micrometer is applied for about 1 second. After application of the current, the characteristics are measured again. The process is then repeated for a predetermined period of time, such as 200 seconds.

In order to determine the changes occurring in the characteristics, typically the results of the re-measurement are evaluated periodically during the testing. By way of example, if the testing process is performed for 100 seconds, and evaluations are done every five seconds, there are twenty evaluations performed during testing with one evaluation performed following testing. If each evaluation lasts two minutes, it takes close to an hour to characterize the damage with no guarantee that the amount of damage induced by processing has been adequately identified.

With the time requirements of conventional techniques to characterize damage, monitoring cannot be performed in real-time during the manufacturing process. Thus, a need exists for monitoring of damage that produces accurate characterization of damage in a short period of time. The present invention addresses such a need.

SUMMARY OF THE INVENTION

The present invention provides efficient methods for detecting damage in a plurality of transistors during fabrication. In one embodiment, detecting damage includes measuring at least one characteristic of the plurality of transistors, applying a constant voltage of a predetermined voltage level for a predetermined period of time, and re-measuring the at least one characteristic of the plurality of transistors, wherein a change in the at least one characteristic indicates damage to the plurality of transistors. In one aspect, the predetermined voltage level is about 9 MV/cm, and the predetermined period of time is about 1 second. In a further aspect, measuring at least one characteristic includes measuring threshold voltage, and the change in the at least one characteristic includes a shift in the threshold voltage. Further, measuring at least one characteristic includes measuring test plurality of transistors in a scribe line area. In addition, the method includes providing protected transistor during the steps of damage detection, wherein the protected plurality of transistors provide a control set for comparing the change in the plurality of transistors and determining an extent of the damage.

In another embodiment, a method for monitoring damage in unprotected plurality of transistors during wafer fabrication includes performing a test sequence including applying a constant voltage of a predetermined voltage level for a predetermined period of time, and utilizing the test sequence in-line with the wafer fabrication. Performing the test sequence further includes measuring at least one characteristic of the unprotected plurality of transistors, applying the constant voltage of the predetermined voltage level for the predetermined period of time, and re-measuring the at least one characteristic of the unprotected plurality of transistors, wherein a change in the at least one characteristic indicates damage to the unprotected plurality of transistors. In addition, detecting damage further includes programmably controlling the steps of performing and utilizing during wafer fabrication, wherein programmably controlling is performed with a computer system.

With the present invention, charging damage induced from processing during fabrication are readily and conveniently identified in-line with the fabrication process. The ability to perform such identification results from an advantageous use of an input voltage for a small time period to reactivate a high percentage of traps in the transistors under test. These and other advantages of the aspects of the present invention will be more fully understood in conjunction with the following detailed description and accompanying drawings.

DETAILED DESCRIPTION

The present invention relates to efficient damage evaluation of transistors during processing. The following description is presented to enable one of ordinary skill in the art to make and use the invention and is provided in the context of a patent application and its requirements. Various modifications to the preferred embodiment and the generic principles and features described herein will be readily apparent to those skilled in the art.

It should be appreciated that the transistors referred to hereinbelow refer to metal oxide semiconductor field effect transistors (MOSFETs) fabricated according to any of a number of well known techniques, including, by way of example, 10 nm (nanometer) oxide, triple metal process techniques, the details and features of which are commonly understood by those skilled in the art.

Figure 1A:
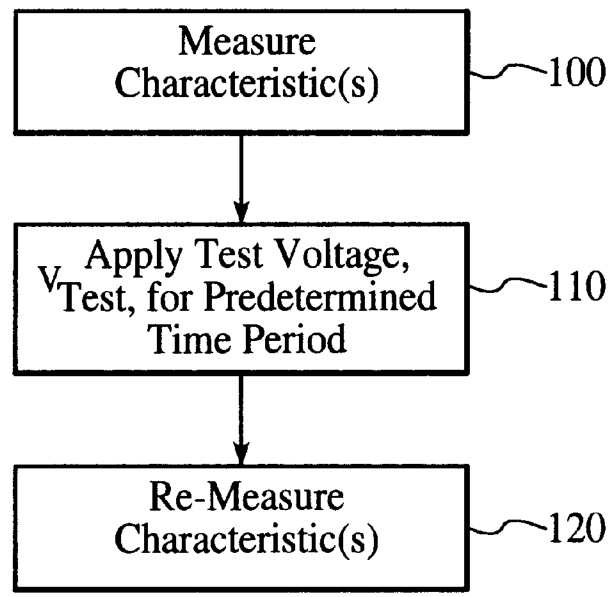
FIG. 1*a* illustrates a method for determining damage in a MOSFET induced during processing in accordance with the present invention.
Figure 1B:
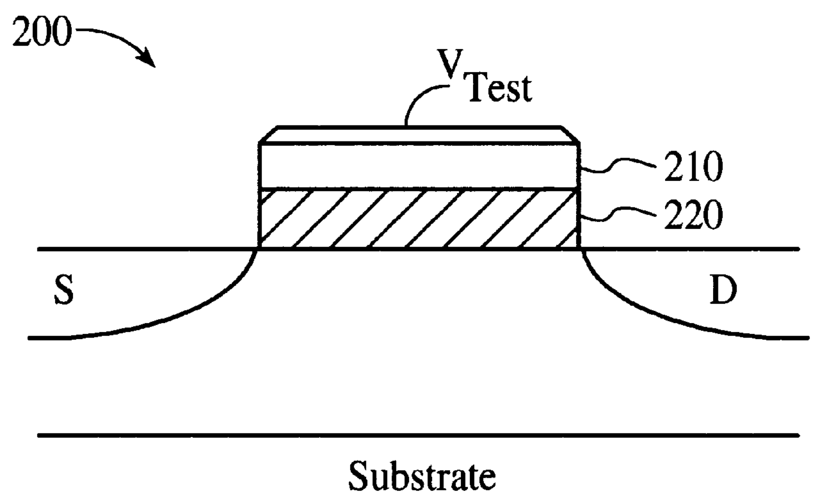
FIG. 1*b* illustrates a cross-sectional view of a MOSFET for reference with the method of FIG. 1*a*.

A method for determining damage in a MOSFET due to plasma processing in accordance with the present invention is illustrated in FIG. 1*a* and described with reference to a cross-sectional illustration of a MOSFET 200 in FIG. 1*b*. At least one characteristic, e.g., $V_t$, of the transistor 200 under test is measured via step 100. A test voltage, $V_{test}$, is then applied via step 110 to a contact point on gate 210 of the transistor 200. Gate 210 is suitably a doped polysilicon gate structure, as is well understood to those skilled in the art. The at least one characteristic of the transistor 200 is preferably remeasured via step 120.

For the application of a test voltage in step 110, a voltage of about 9 megavolts per centimeter of gate area (9 MV/cm) for about 1 second has been found by the inventors to work well. Of course, the amount of voltage applied may vary and be optimized for a particular process but should be chosen to produce a small amount of Fowler-Nordheim charge injection, i.e., a charge density of about 0.1 mC/cm$^2$ of the gate oxide layer 220 (milliCoulombs per square centimeter of gate oxide area) to reactivate passivated interface traps in damaged devices without generating interface traps in undamaged devices.

Figure 2:
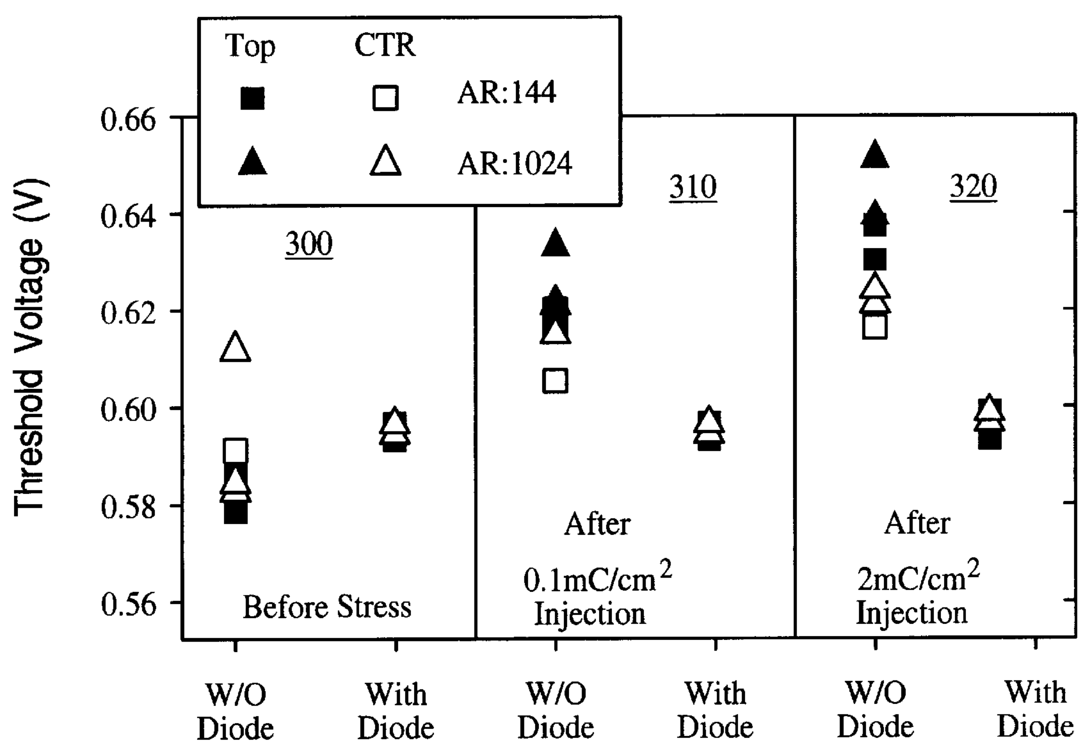
FIG. 2 shows a graph illustrating threshold voltage shift in a damaged transistor.
Figure 3:
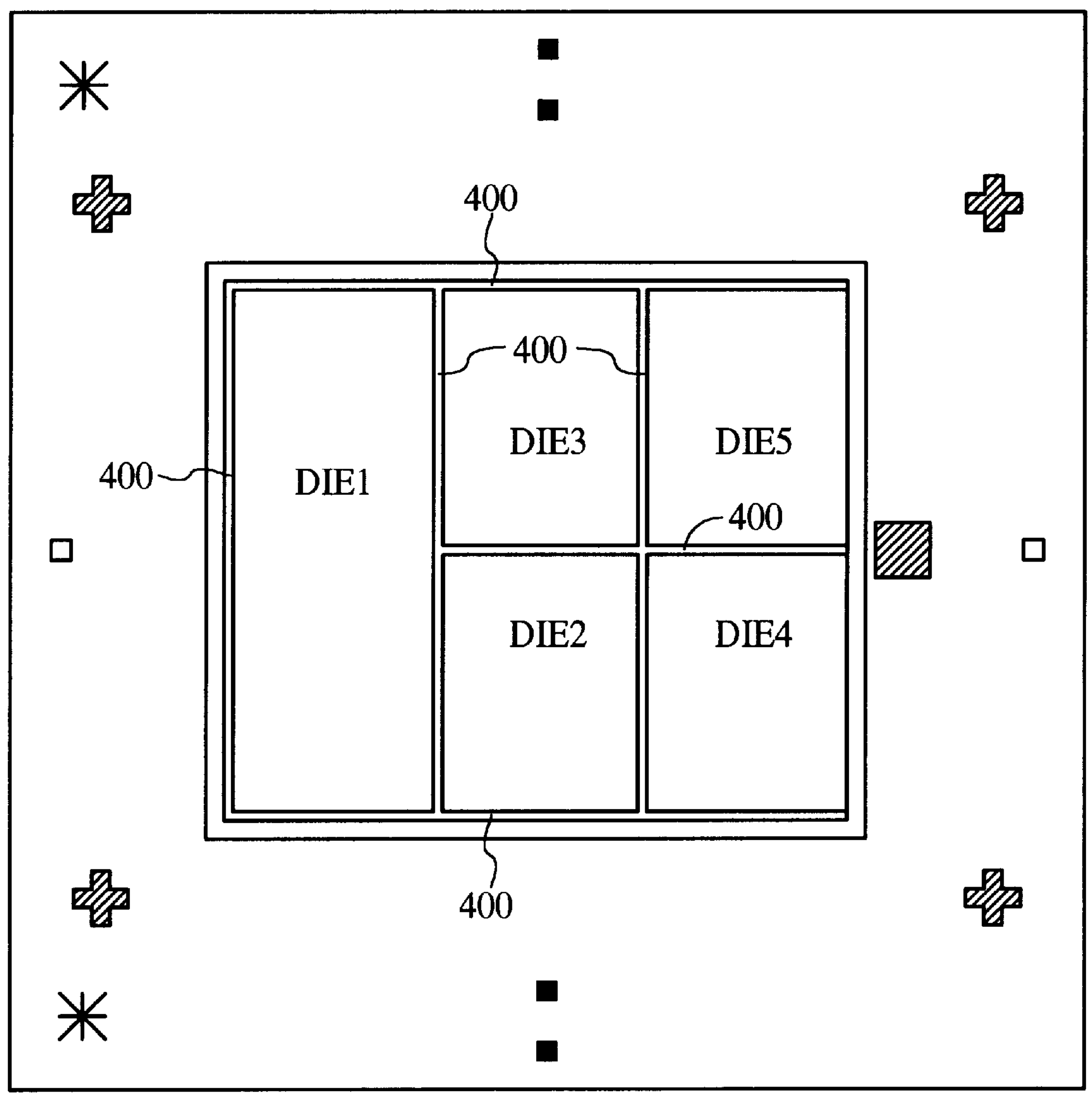
FIG. 3 illustrates scribe line areas 400 in a top view of an example of a wafer layout of dies.

A graph illustrating the ability of the method for detecting damage in accordance with the present invention by detecting the threshold voltage shift in a damaged transistor is presented in FIG. 2. Test transistors in top and center portions of a wafer (top and center preferably referring to designations in relation to the flat of a wafer, as is well known to those skilled in the art) of two sizes are plotted on the graph. In the top portion measurements, transistors of a first size are represented by solid squares and of a second size are represented by solid triangles. In the center portion, transistors of the first size are designated with open squares and of the second size are designated with open triangles. By way of example, the first size suitably refers to transistors having an antenna ratio (AR) of 144, while the second size suitably refers to transistors having an antenna ratio of 1024, the antenna ratio preferably referring to the ratio of the area of the antenna, i.e., the metal contact layers over the gate, to the area of the gate oxide. By way of further example, the test transistors are suitably formed within scribe line areas of a wafer, such as the scribe line areas 400 illustrated in a top view of an example of a wafer layout of dies in FIG. 3.

The graph of FIG. 2 illustrates plots of the measurements of the threshold voltage, $V_t$, before application of the test voltage in portion 300. After the application of the test voltage for the predetermined time period in accordance with a preferred embodiment of the present invention, i.e., 9 MV/cm for 1 second, to induce the 0.1 mC/cm$^2$ charge injection into the transistor, the threshold voltage is measured again. As shown in portion 310 of the graph, the test transistors (as designated in the "w/o diode" column) exhibit a threshold voltage shift of approximately 0.04–0.05 V. After approximately twenty applications of the test voltage for the predetermined period of time, the test transistors only exhibit a slight further shift (approximately 0.01–0.02 V) in the threshold voltage, as shown in graph portion 320. As is further indicated, the transistors with a larger antenna ratio exhibit more damage than the transistors with a smaller antenna ratio.

Comparisons of the results as shown in portions 310 and 320 particularly illustrate that a single application of the test voltage for the predetermined period of time in accordance with the present invention reactivates approximately 60–70% of the interface traps originally generated by process damage and passivated by forming a gas anneal. Thus, the present invention capably provides damage detection in approximately one second which allows for real-time evaluations during fabrication.

FIG. 2 further illustrates effects on transistors that are protected with a diode. As shown in portions 300, 310, and 320, the transistors with diode protection exhibit negligible threshold voltage shift during the test sequence according to the present invention. Thus, these diode protected transistors are suitably used as a control set of transistors to allow comparisons of the damage measurements with the unprotected transistors, as is well appreciated by those skilled in the art.

Figure 4A:
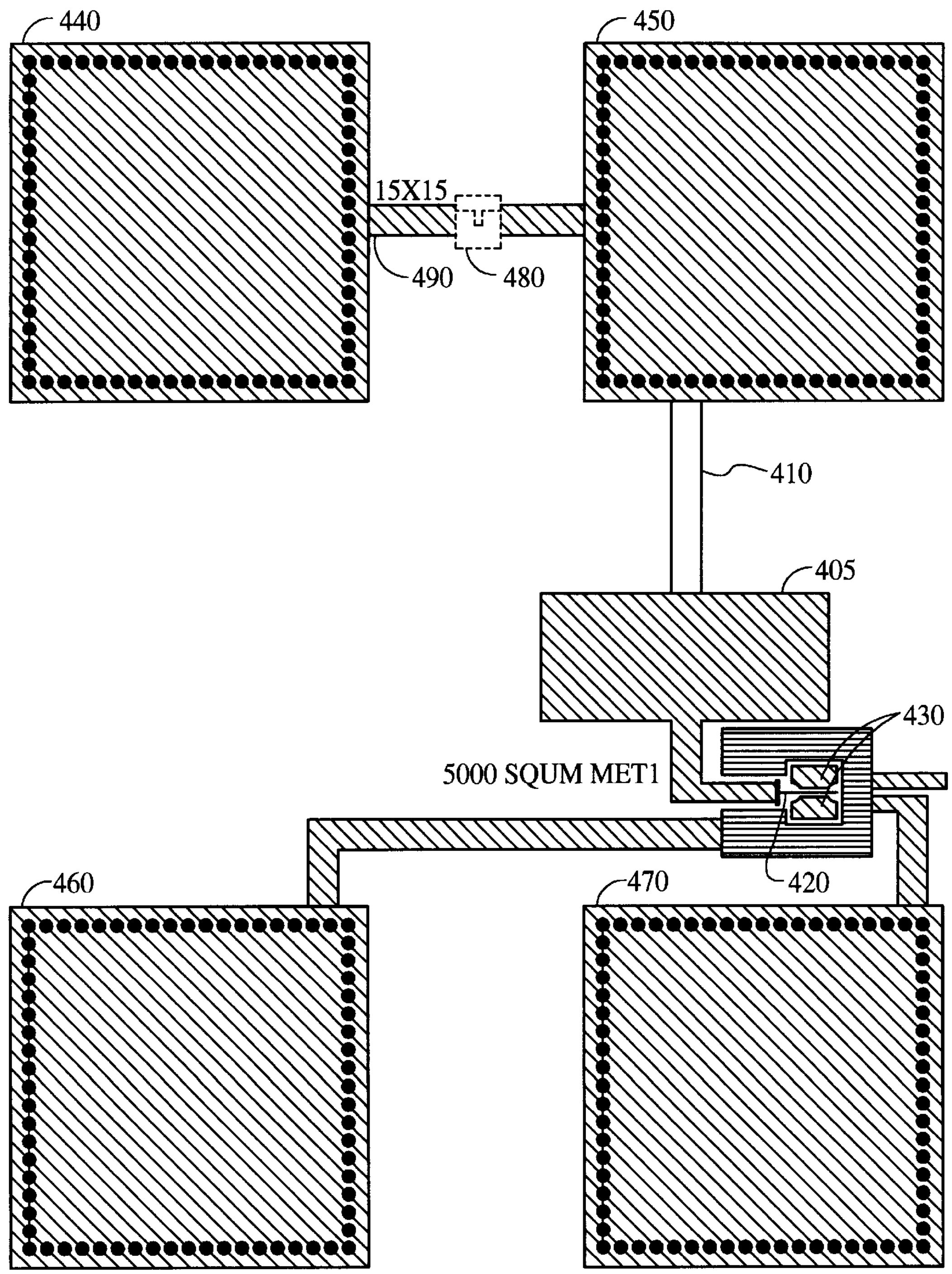
FIGS. 4*a*, 4*b*, and 4*c* illustrate protected and unprotected transistor configurations suitable for use with the present invention.
Figure 4B:
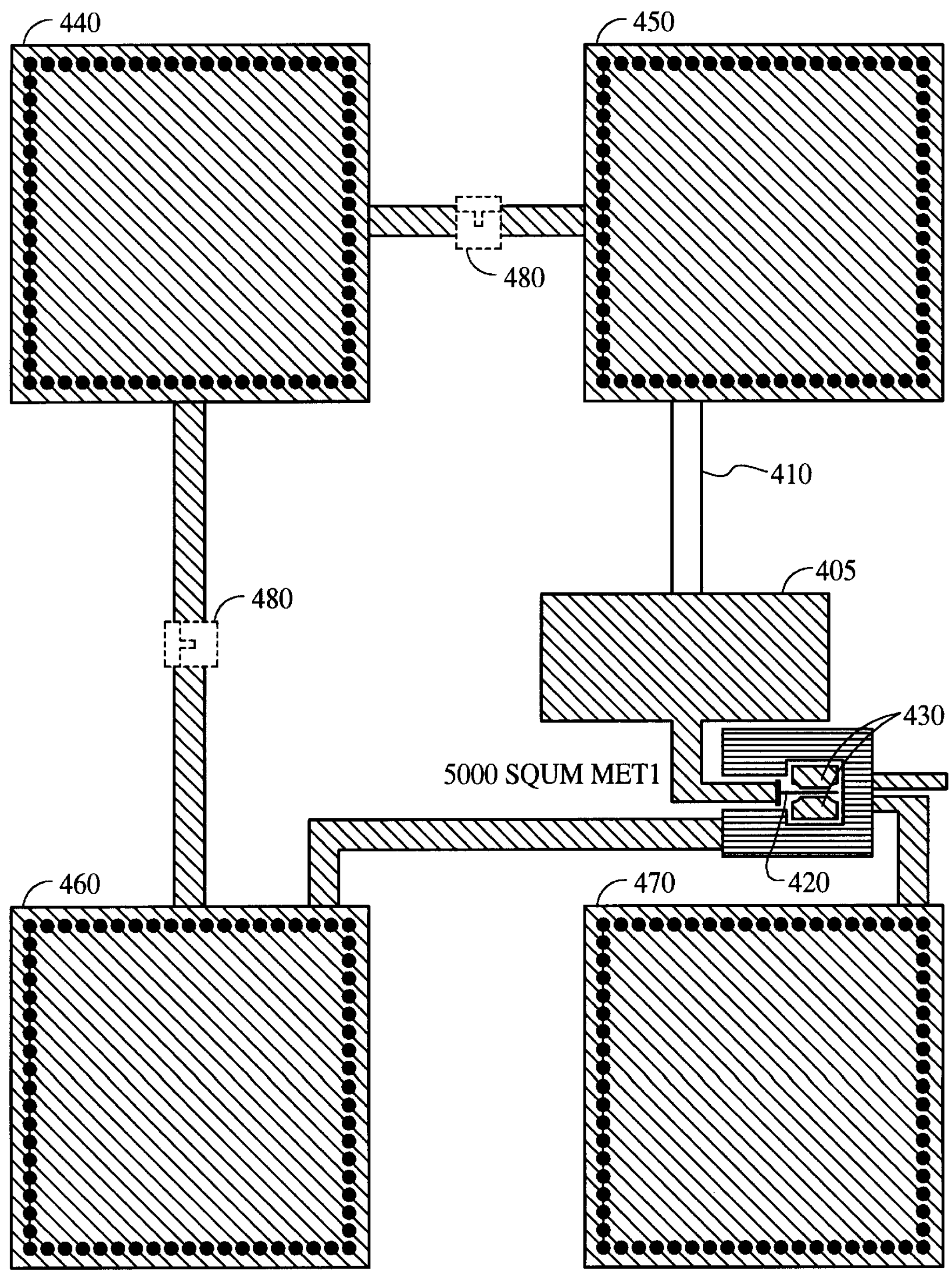
Figure 4C:
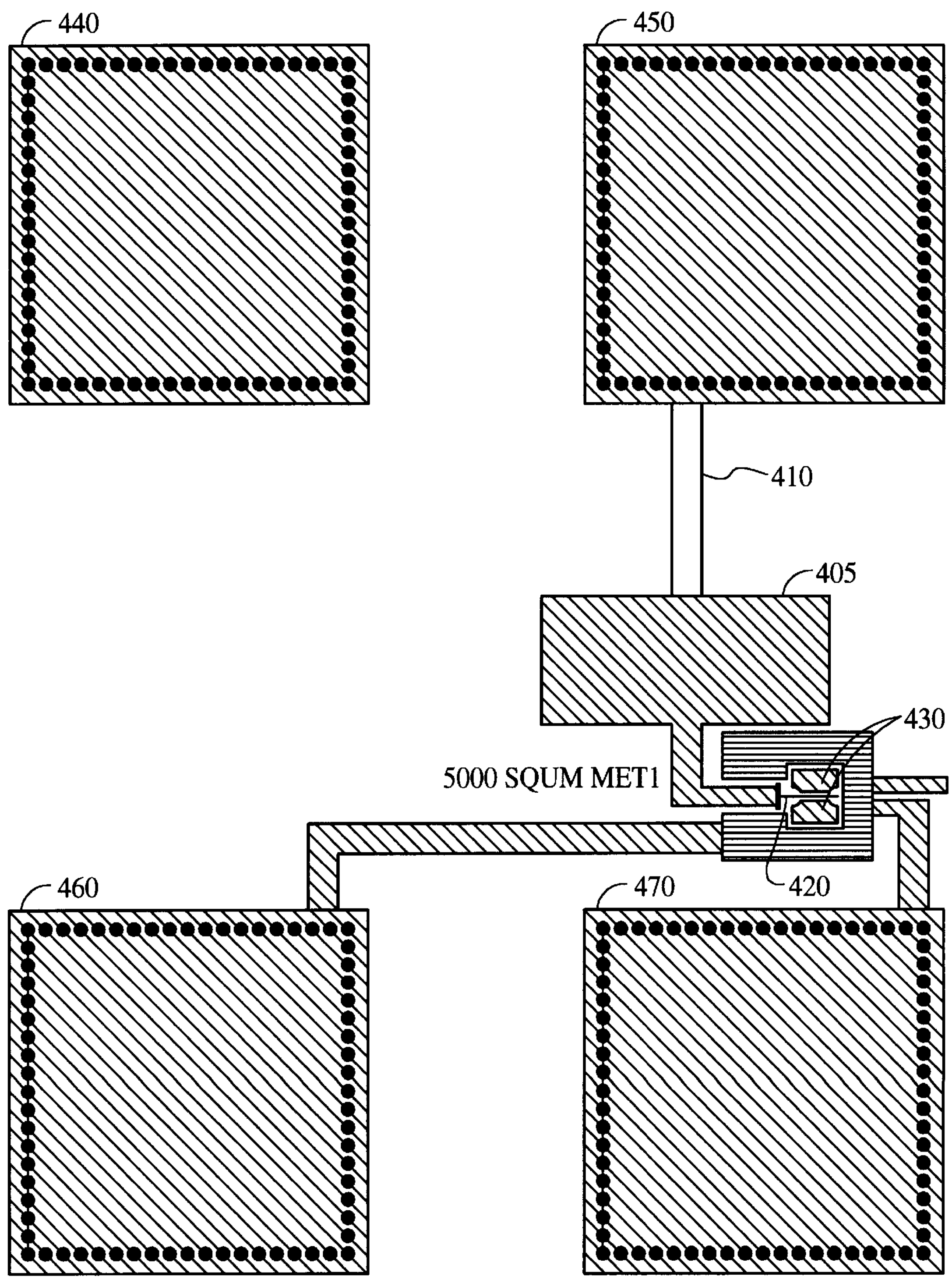

By way of example, protected and unprotected transistor configurations are more particularly illustrated in FIGS. 4*a,* 4*b,* and 4*c,* in which like features are numbered similarly. FIGS. 4*a* and 4*b* illustrate two configurations of protected transistor configurations, while FIG. 4*c* illustrates an unprotected transistor configuration. A test transistor within each of these configurations includes a first metal layer 405, a second metal layer 410, a polysilicon gate 420, and source/drain regions 430. Further included in the configurations are contact pads 440, 450, 460, and 470. Contact pad 450 suitably represents a gate contact pad, contact pad 460 suitably represents a well/substrate contact pad, and contact pad 470 suitably represents a source/drain contact pad. Fuses 480 are further included in the configurations and are blown away as is appropriate to isolate the contact pads, as is well appreciated by those skilled in the art.

For FIG. 4*a,* a diode 490 suitably exists between contact pads 440 and 450, thus forming a diode protected configuration for the test transistor. In FIG. 4*b,* the protection results from an equal potential application to the gate contact pad 450 and well contact pad 460. In contrast, the configuration of FIG. 4*c* lacks either of these protection mechanisms and therefore is an unprotected configuration. Accordingly, for the plots of testing results, the protected configurations of FIGS. 4*a* and 4*b* are suitably represented by the 'w/diode' labeling, while the unprotected configuration of FIG. 4*c* is suitably represented by the 'w/o diode' labeling.

Figure 5:
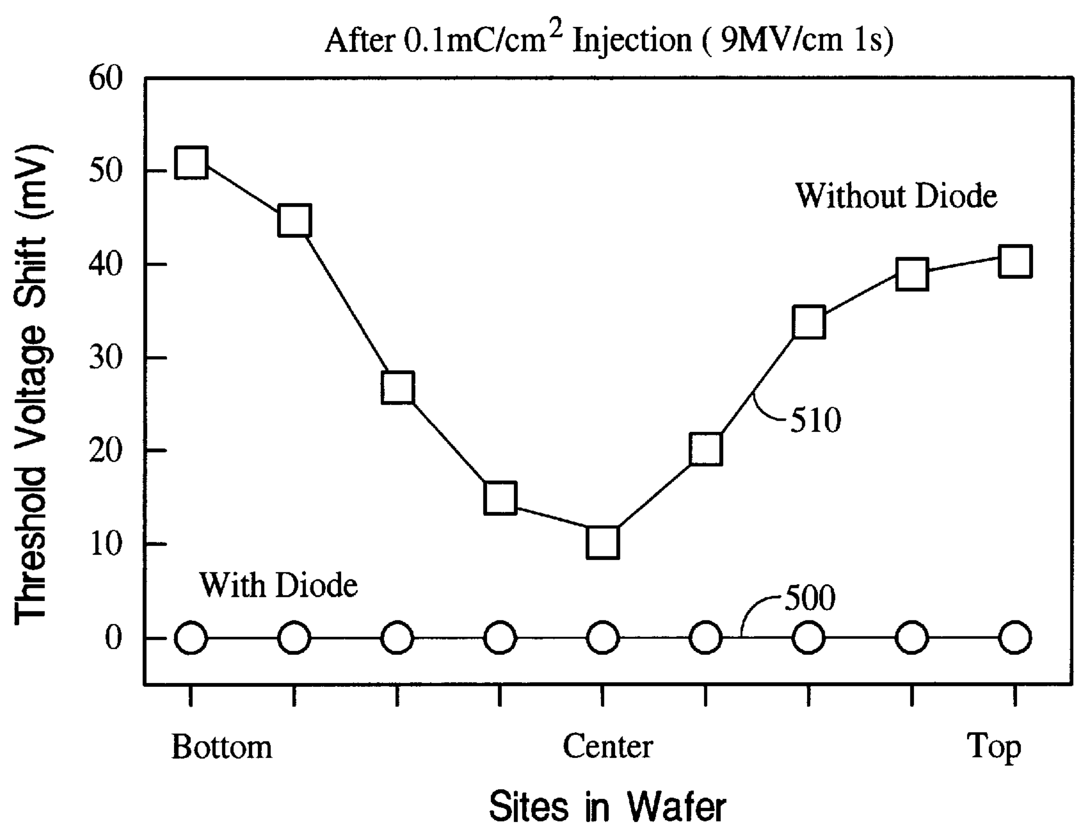
FIG. 5 illustrates a plot of threshold voltage shift in various portions of a wafer for both protected and unprotected transistor configurations.

To further illustrate the results of employing the present invention to detect damage, FIG. 5 illustrates shifts in $V_t$ versus location on the wafer for both protected and unprotected configurations. As shown by the substantially horizontal plot 500, the protected transistors exhibit negligible $V_t$ shift and are thus suitable as a control set for comparison purposes. In contrast, the unprotected configurations exhibit a range of $V_t$ shifts depending on their top, center, or bottom location on the wafer. Such variations are typically due to a variation in a processing variable, such as implant dosage, plasma density or plasma profile across the wafer. Overall, however, the plot 510 appropriately depicts the ability of a single application of a test voltage in accordance with the present invention to detect $V_t$ shifts in damage transistors.

With the ability to detect transistor damage after approximately a single second application of a constant voltage, the present invention is much faster and more efficient than conventional damage detection techniques. Further, the reduced time requirements for performing the testing with the present invention allows the testing to be applied in wafer level manufacturing/fabrication environments to provide real-time monitoring of process-induced damage. Preferably, the testing sequence is controlled via programming in a computer system during fabrication, such as with the use of any suitable parametric tester, as is well appreciated by those skilled in the art.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for detecting damage in a plurality of transistors during wafer fabrication, the method comprising:

measuring at least one characteristic of each of the plurality of transistors, a change in the at least one characteristic being capable of indicating damage to at least one of the plurality of transistors;

applying a constant voltage of a predetermined voltage level for a predetermined period of time, the predetermined period of time being sufficiently short to allow real-time detection of the damage during fabrication of the plurality of transistors, the predetermined time period being approximately one second; and re-measuring the at least one characteristic of each of the plurality of transistors wherein the change in the at least one characteristic indicates damage to at least one of the plurality of transistors.

2. The method of claim 1 wherein the predetermined voltage level is about 9 MV/cm.

3. The method of claim 1 wherein the at least one characteristic further includes a threshold voltage.

4. The method of claim 3 wherein the change in the at least one characteristic comprises a shift in the threshold voltage.

5. The method of claim 1 wherein measuring at least one characteristic further comprises measuring a test plurality of transistors in a scribe line area.

6. The method of claim 1 further comprising including a protected plurality of transistors during the steps of damage detection, wherein the protected plurality of transistors provide a control set for comparing the change in the plurality of transistors and determining an extent of the damage detection.

7. The method of claim 6 wherein the protected plurality of transistors further comprises including diode protected transistor configurations.

8. The method of claim 6 wherein the protected plurality of transistors further comprises including transistor configurations for equal potential application to gate and well contacts.

9. The method of claim 1 wherein the step of applying a constant voltage is performed only once.

10. A method for detecting damage in a transistor during wafer fabrication, the method comprising:

measuring at least one characteristic of the transistor, a change in the at least one characteristic being capable of indicating damage to the transistor;

applying a constant voltage of a predetermined voltage level for a predetermined period of time, the predetermined period of time being sufficiently short to allow real-time detection of the damage during fabrication of the transistor, the predetermined period being approximately one second; and re-measuring the at least one characteristic of the transistor wherein the change in the at least one characteristic indicates damage to the transistor.

* * * * *